United States Patent
Naito et al.

(10) Patent No.: US 7,439,451 B2
(45) Date of Patent: Oct. 21, 2008

(54) TAPE CARRIER

(75) Inventors: Toshiki Naito, Ibaraki (JP); Toshihiko Omote, Ibaraki (JP); Hiroshi Yamazaki, Ibaraki (JP)

(73) Assignee: Nitto Denko Corporation, Tokyo (JP)

( * ) Notice: Subject to any disclaimer, the term of this patent is extended or adjusted under 35 U.S.C. 154(b) by 290 days.

(21) Appl. No.: 10/728,911

(22) Filed: Dec. 8, 2003

(65) Prior Publication Data

US 2004/0207069 A1  Oct. 21, 2004

(30) Foreign Application Priority Data

Dec. 9, 2002  (JP)  .............. P2002-356847

(51) Int. Cl.
*H05K 1/16*  (2006.01)

(52) U.S. Cl. .......... 174/260; 174/258; 174/261

(58) Field of Classification Search .......... 174/268, 174/254, 260; 361/804, 736, 737, 760; 257/668–710
See application file for complete search history.

(56) References Cited

U.S. PATENT DOCUMENTS

| | | | | |
|---|---|---|---|---|
| 4,286,860 A | * | 9/1981 | Gursky et al. | 396/624 |
| 4,944,850 A | * | 7/1990 | Dion | 205/125 |
| 4,956,605 A | * | 9/1990 | Bickford et al. | 324/760 |
| 5,023,202 A | * | 6/1991 | Long et al. | 29/827 |
| 5,136,827 A | * | 8/1992 | Sawaya | 53/453 |
| 5,177,596 A | * | 1/1993 | Muramatsu et al. | 174/254 |
| 5,389,191 A | * | 2/1995 | Muramatsu et al. | 156/510 |
| 5,578,919 A | * | 11/1996 | Semba et al. | 324/158.1 |
| 5,837,154 A | * | 11/1998 | Okabe et al. | 216/14 |
| 5,866,852 A | | 2/1999 | Benz et al. | |
| 5,960,961 A | * | 10/1999 | Gutentag | 206/714 |
| 5,975,178 A | * | 11/1999 | Otsuka et al. | 156/358 |
| 6,057,174 A | * | 5/2000 | Hashimoto | 438/110 |
| 6,143,586 A | * | 11/2000 | Chia et al. | 438/106 |
| 6,313,526 B1 | * | 11/2001 | Nakamura | 257/706 |
| 6,465,876 B1 | * | 10/2002 | Kitano et al. | 257/668 |
| 6,740,966 B2 | * | 5/2004 | Nakamura | 257/701 |
| 2002/0152609 A1 | | 10/2002 | Choi et al. | |

FOREIGN PATENT DOCUMENTS

| | | |
|---|---|---|
| CH | 622 163 A3 | 3/1981 |
| EP | 0 415 633 A1 | 3/1991 |
| JP | 8-83819 A | 3/1996 |
| JP | 2002-076068 A | 3/2002 |

* cited by examiner

*Primary Examiner*—Tuan T Dinh
(74) *Attorney, Agent, or Firm*—Sughrue Mion, PLLC

(57) ABSTRACT

Only individual piece-like flexible wiring boards produced separately and judged to be non-defective products in an inspection step in advance are mounted at regular intervals on a carrying support film to thereby obtain a TAB tape carrier. According to this method, the yield on continuous production can be improved while the step of replacing defective flexible wiring boards found by inspection with non-defective flexible wiring boards can be omitted after mounting of the flexible wiring boards. A difference in level between the respective flexible wiring boards can be prevented from being caused by the replacement, so that high connection reliability can be ensured.

7 Claims, 4 Drawing Sheets

TAPE CARRIER

BACKGROUND OF THE INVENTION

1. Field of the Invention

The present invention relates to a tape carrier for TAB (hereinafter referred to as "TAB tape carrier") and a method for producing the same and particularly to a TAB tape carrier for mounting electronic parts by a TAB method and a method for producing the same.

2. Related Art

A TAB tape carrier is widely used for mounting electronic parts such as semiconductor devices by a TAB (Tape Automated Bonding) method. Generally, in the TAB tape carrier, a plurality of wiring circuits for mounting electronic parts are provided at regular intervals.

The wiring circuits may contain defective products having electrical failure or visual failure. In such a case, electronic parts are mounted while defective products are avoided at the time of mounting electronic parts. The yield on continuous production is however lowered when electronic parts are mounted while defective products are avoided.

On the other hand, for example, a method applied to an MTCP (multi-chip TCP formed in such a manner that a plurality of semiconductor chips each having a built-in memory are electrically connected (linked) while mechanically connected as a horizontal row to a tape carrier of a TCP (Tape Carrier Package)) has been described in Japanese Patent Laid-Open No. 2002-76068A. In the method, the plurality of semiconductor chips mechanically and electrically connected to the tape carrier are inspected in an inspection step. When any semiconductor chip as a defective product having electrical failure or visual failure is found, the semiconductor chip as a defective product is punched together with a portion of the tape carrier where the semiconductor chip as a defective product is connected. A non-defective piece, which is formed in such a manner that a semiconductor chip non-defective in terms of electricity and external appearance is connected to a tape carrier and which is similar in shape to and slightly larger in size than the punched portion, is mechanically and electrically connected to the punched portion by soldering. In this manner, lowering of the yield in production is prevented.

The aforementioned method is however to be applied to an MTCP. In the MTCP, it is necessary to punch the defective semiconductor chip along with the tape carrier because all semiconductor chips including the defective one are mechanically and electrically connected to the tape carrier. It is therefore necessary to replace the punched portion with a non-defective semiconductor chip along with a tape carrier similar in shape to but slightly larger in size than the punched portion and solder the non-defective semiconductor chip to connect the non-defective semiconductor chip mechanically and electrically.

When a non-defective individual piece of tape carrier larger than the punched portion is soldered to the punched portion in this manner, the non-defective individual piece of tape carrier is piled on the punched portion of the tape carrier so that a difference in level is formed in the overlapping portion.

On the other hand, when a defective product in the plurality of wiring circuits provided in the TAB tape carrier is to be replaced by the same method as described above, a wiring circuit judged as a defective product is first punched out along with part of the tape carrier on which the defective wiring circuit is disposed. Then, a non-defective wiring circuit is provided on the punched portion so that a tape carrier similar in shape to but slightly larger in size than the punched portion is laminated on the punched portion. Also in this case, a difference in level is still formed in the overlapping portion.

In the TAB tape carrier, electronic parts are however mounted on wiring circuits respectively, for example, by solder joint after that. Accordingly, at the time of mounting such electronic parts, the difference in level unfavorably causes lowering of reliability of connection between the electronic parts and the wiring circuits.

In addition, in the aforementioned method, in the case where a defective semiconductor chip is found by inspection in an inspection step after semiconductor chips are mounted on a tape carrier, part of the tape carrier is punched out along with the defective semiconductor chip and then a non-defective individual piece is soldered. Accordingly, the labor required for punching and soldering is troublesome, and production cost increases inevitably.

SUMMARY OF THE INVENTION

The invention is developed in consideration of such circumstances and an object of the invention is to provide a TAB tape carrier in which the yield on continuous production can be improved in spite of simple configuration and in which high connection reliability can be ensured while both improvement in production efficiency and reduction in production cost can be attained, and a method for producing the TAB tape carrier.

To achieve the foregoing object, the invention provides a TAB tape carrier including a carrying support film, and individual piece-like flexible wiring boards judged to be non-defective products in an inspection step and mounted at regular intervals on the carrying support film.

In the TAB tape carrier, individual piece-like flexible wiring boards judged to be non-defective products in an inspection step in advance are mounted on the carrying support film. Accordingly, flexible wiring boards as defective products can be initially prevented from being mounted on the carrying support film. For this reason, it is unnecessary to punch out defective flexible wiring boards along with part of the carrying support film and replace the defective flexible wiring boards with non-defective flexible wiring boards in a process after that. Accordingly, a difference in level between flexible wiring boards can be prevented from being caused by the replacement. As a result, the yield on continuous production can be improved in spite of simple configuration, and high connection reliability can be ensured while both improvement in production efficiency and reduction in production cost can be attained.

Preferably, in the TAB tape carrier according to the invention, each of the flexible wiring boards is mounted on the carrying support film through an adhesive agent.

When each of the flexible wiring boards is bonded to the carrying support film through an adhesive agent, the difference in level can be more surely prevented from being formed between flexible wiring boards.

Preferably, in the TAB tape carrier according to the invention, opening portions are formed in portions of the carrying support film on which the flexible wiring boards will be mounted respectively.

When opening portions are formed in portions of the carrying support film on which the flexible wiring boards will be mounted respectively, electronic parts can be mounted on the other surface of the carrying support film even in the case where the flexible wiring boards are mounted on one surface of the carrying support film.

Preferably, the carrying support film used in the TAB tape carrier according to the invention is a polyimide film.

When the carrying support film is a polyimide film, the TAB tape carrier can be produced as a high-strength TAB tape carrier excellent in heat resistance and acid resistance.

The invention also provides a method of producing a TAB tape carrier including: a production step of producing individual piece-like flexible wiring boards; an inspection step of inspecting the individual piece-like flexible wiring boards; and a mounting step of mounting only individual piece-like flexible wiring boards judged to be non-defective products in the inspection step, at regular intervals on a carrying support film.

According to this method, only individual piece-like flexible wiring boards produced in the production step and judged to be non-defective products in the inspection step are mounted on the carrying support film in the mounting step. Accordingly, the step of replacing defective flexible wiring boards found by inspection with non-defective flexible wiring boards can be omitted compared with the case where flexible wiring boards are inspected after mounted on the carrying support film. For this reason, the TAB tape carrier can be produced as a TAB tape carrier on which flexible wiring boards of high connection reliability can be mounted while the yield on continuous production can be prevented from being lowered and while both improvement in production efficiency and reduction in production cost can be attained by simplification of the production process.

DETAILED DESCRIPTION OF THE PREFERRED EMBODIMENTS

Figure 1:
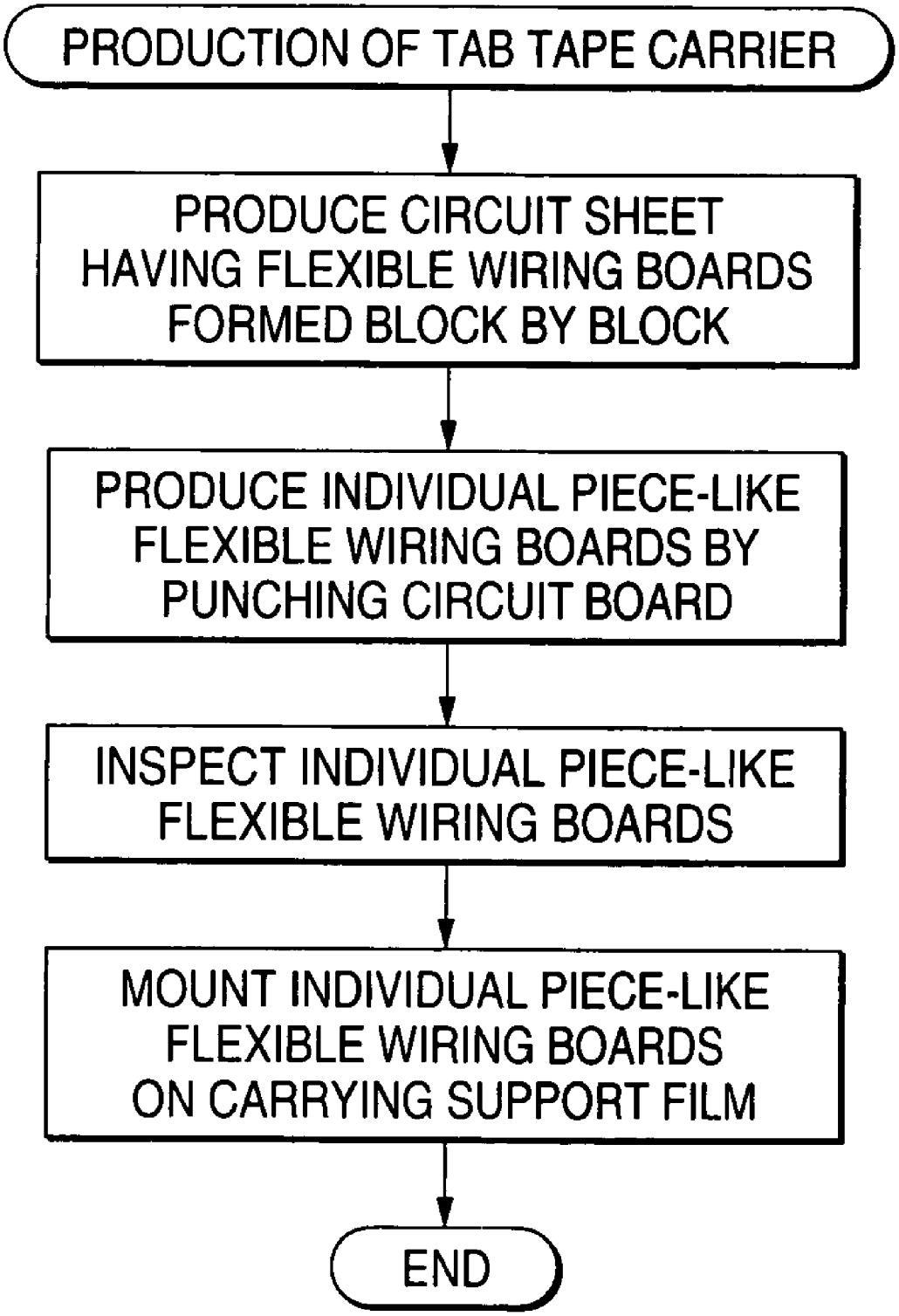
FIG. 1 is a flow chart showing an embodiment of a method for producing a TAB tape carrier according to the invention.

FIG. 1 is a flow chart showing an embodiment of a method for producing a TAB tape carrier according to the invention. Referring to FIG. 1, the method for producing a TAB tape carrier according to the invention and the TAB tape carrier according to the invention will be described as an embodiment.

Figure 2A:
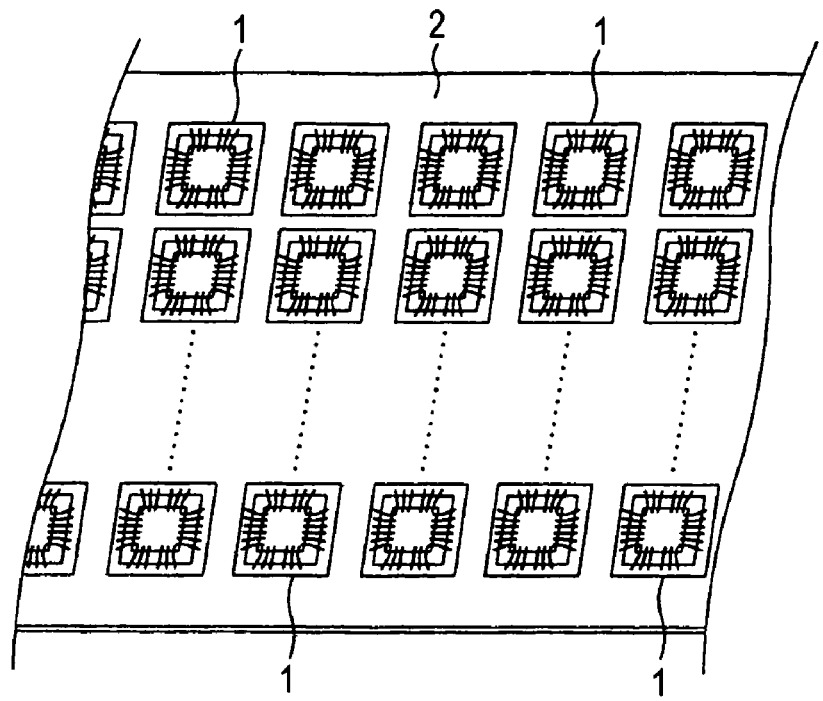
FIGS. 2A to 2C show views in the TAB tape carrier producing method depicted in FIG. 1, FIG. 2A being a perspective view showing a circuit sheet, FIG. 2B being a plan view of important part of the circuit sheet depicted in FIG. 2A, FIG. 2C being a sectional view taken along the line A-A' in FIG. 2B.

In FIG. 1, first, in the method, individual piece-like flexible wiring boards are produced. In the production of the individual piece-like flexible wiring boards, as shown in FIG. 2A, a circuit sheet 2 is first produced so that a plurality of flexible wiring boards 1 are formed block by block so as to be arranged at designated intervals.

Figure 2B:
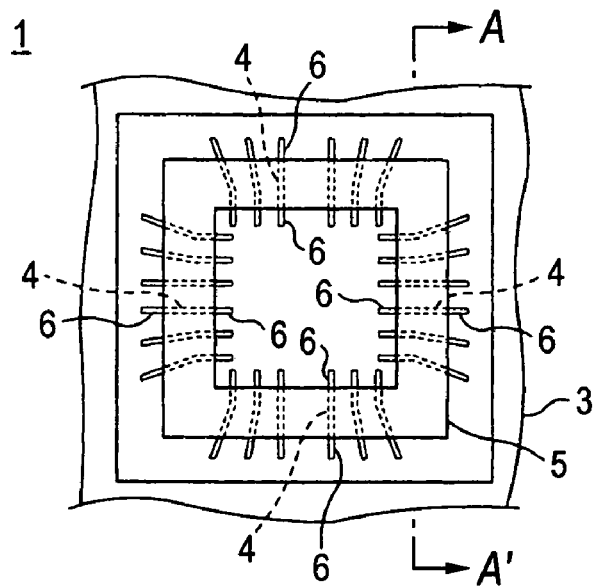
Figure 2C:
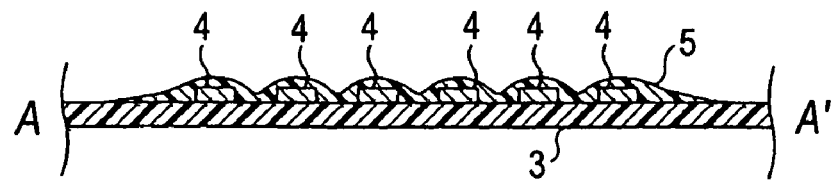

The production of the circuit sheet 2 is not particularly limited. A known method of forming a plurality of flexible wiring boards as continuous patterns in the form of a sheet can be used. For example, as shown in FIGS. 2B and 2C, first, an electrically insulting base layer 3 made of a resin film such as a polyimide film is prepared. An electric conductor layer 4 made of metal foil such as copper foil is formed as a predetermined wiring circuit pattern corresponding to each flexible wiring board 1 on the electrically insulating base layer 3 by a known patterning method such as a subtractive method, an additive method, or a semi-additive method. Then, an electrically insulating cover layer 5 made of a resin film such as a polyimide film is formed so that the electric conductor layer 4 is covered with the electrically insulating cover layer 5.

An adhesive layer not shown may be interposed between the electrically insulating base layer 3 and the electric conductor layer 4 or between the electric conductor layer 4 and the electrically insulating cover layer 5 if necessary. The electrically insulating base layer 3 and the electrically insulating cover layer 5 may be formed as a predetermined pattern from a photosensitive resin by a patterning method using exposure and development.

In the circuit sheet 2 formed in this manner, an opening portion is formed in the electrically insulating base layer 3 and/or the electrically insulating cover layer 5 of each flexible wiring board 1 by patterning of the photosensitive resin, etching, drilling or the like. The electric conductor layer 4 is exposed out of the opening portion, so that the exposed portions are used as connection terminal portions 6 for performing connection to electronic parts (not shown) such as semiconductor devices.

In the circuit sheet 2, the thickness of the electrically insulating base layer 3 and the electrically insulating cover layer 5 is preferably selected to be, for example, in a range of from 3 μm to 100 μm, especially in a range of from 5 μm to 50 μm. The thickness of the electric conductor layer 4 is preferably selected to be, for example, in a range of from 3 μm to 50 μm, especially in a range of from 5 μm to 20 μm.

Although FIGS. 2A to 2C show the case where each flexible wiring board 1 is a single-side wiring board of a single-layered structure having a single electric conductor layer 4, the structure of each flexible wiring board 1 in the invention is not particularly limited. For example, a single-side wiring board, a double-side wiring board or a multi-layer wiring board can be selected suitably according to the purpose and application. Generally, as each flexible wiring board 1 is formed as a multi-layer board, the percentage of non-defective products is reduced. Accordingly, the excellent effect of the invention as will be described later can be exhibited more greatly.

Then, in this method, as shown in FIG. 1, respective flexible wiring boards 1 are block-by-block punched out of the circuit sheet 2 formed in the aforementioned manner to thereby form individual piece-like flexible wiring boards 1.

Incidentally, the individual piece-like shape of each individual piece-like flexible wiring board 1 is decided suitably by punching in accordance with the purpose and application. Usually, the individual piece-like shape is rectangular. The longitudinal width of the shape (i.e., the length in the lengthwise direction when each flexible wiring board 1 is mounted on a carrying support film 7 which will be described later) is preferably selected to be, for example, in a range of from 10 mm to 100 mm, especially in a range of from 15 mm to 70 mm. The lateral width of the shape (i.e., the length in the widthwise direction when each flexible wiring board 1 is mounted on a carrying support film 7 which will be described later) is preferably selected to be, for example, in a range of from 10 mm to 65 mm, especially in a range of from 20 mm to 45 mm.

Then, in this method, the respective flexible wiring boards 1 are inspected. The inspection step includes known inspection such as visual inspection or electric inspection (current conduction inspection) which is inspection usually carried out on flexible wiring boards for discriminating between non-detective products and defective products.

In this method, flexible wiring boards 1 judged as defective products in the inspection step are removed and only flexible wiring boards 1 judged as non-defective products are mounted on the carrying support film 7 so as to be arranged at predetermined intervals.

Figure 3A:
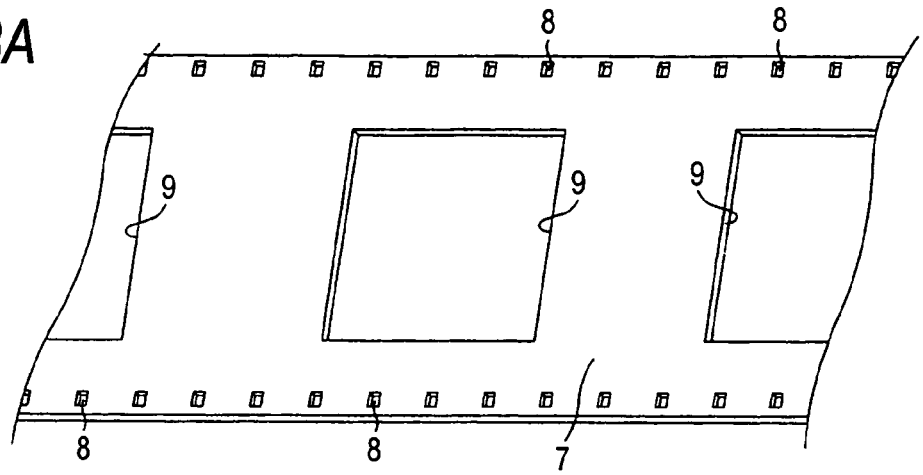
FIGS. 3A to 3C show views in the TAB tape carrier producing method depicted in FIG. 1, FIG. 3A being a perspective view showing a carrying support film, FIG. 3B being a perspective view showing a state in which an individual piece-like flexible wiring board is to be mounted on the carrying support film, FIG. 3C being a perspective view showing a state in which individual piece-like flexible wiring boards have been already mounted on the carrying support film.

As shown in FIG. 3A, the carrying support film 7 is shaped like a long tape extending in the lengthwise direction. The carrying support film 7 is made of a resin film of a resin such as polyimide, polyethylene terephthalate, polyethylene naphthalate, polyether nitrile, polyether sulfone or polyvinyl chloride; a sheet of metal foil of a metal such as stainless steel or copper; or a copper-clad laminate usually used as a base material of a flexible wiring board. Preferably, the carrying support film 7 is made of a polyimide film. When the carrying support film 7 is made of a polyimide film, a high-strength TAB tape carrier excellent in heat resistance and acid resistance can be produced.

Two rows of perforations 8 are formed along the lengthwise direction in widthwise-direction (direction perpendicular to the lengthwise direction) opposite end portions of the carrying support film 7. The two rows of perforations 8 are formed opposite to each other in the widthwise direction so as to be engaged with sprockets or the like for carrying the carrying support film 7. Each of the perforations 8 is formed to be substantially shaped like a rectangle so that the perforations 8 pierce the carrying support film 7 at regular intervals in the lengthwise direction of the carrying support film 7.

Incidentally, the width of the carrying support film 7 is set at a value such as 35 mm, 48 mm or 70 mm according to a general standard of TAB. The thickness of the carrying support film 7 formed is, for example, in a range of from about 25 µm to about 125 µm. Each perforation 8 is formed, for example, as a hole 1.981 mm square. The interval of arrangement of the perforations 8 is set, for example, at 4.75 mm.

A plurality of opening portions 9 are further formed in the carrying support film 7 in accordance with portions for mounting the flexible wiring boards 1 as will be described later.

That is, though not particularly limited, each opening portion 9 is generally formed to have a figure (e.g. a rectangular figure corresponding to the rectangularly shaped flexible wiring board 1 in FIGS. 3A to 3C) similar in shape to but slightly smaller in size than the figure of a corresponding individual piece-like flexible wiring board 1 (at a reduction ratio of 1-99% to the flexible wiring board 1) so that each opening portion 9 pierces the carrying support film 7. The opening portions 9 are formed at regular intervals along the lengthwise direction of the carrying support film 7.

Each opening portion 9 is not particularly limited but can be formed, for example, by die-punching the carrying support film 7. Preferably, the longitudinal width (length in the lengthwise direction of the carrying support film 7) of each opening portion 9 is selected to be, for example, in a range of from 9 mm to 99 mm, especially in a range of from 14 mm to 69 mm. Preferably, the lateral width (length in the widthwise direction of the carrying support film 7) of each opening portion 9 is selected to be, for example, in a range of from 9 mm to 64 mm, especially in a range of from 19 mm to 44 mm. Preferably, the pitch (pitch in the lengthwise direction of the carrying support film 7) of arrangement of the opening portions 9 is selected to be in a range of from 1 mm to 10 mm, especially in a range of from 3 mm to 7 mm.

When the opening portions 9 are formed in this manner, electronic parts can be mounted on the flexible wiring boards 1 respectively from a rear surface side (side opposite to a surface side of the carrying support film 7 on which the flexible wiring boards 1 are mounted) after the flexible wiring boards 1 are mounted on the opening portions 9 respectively as will be described later.

Figure 3B:
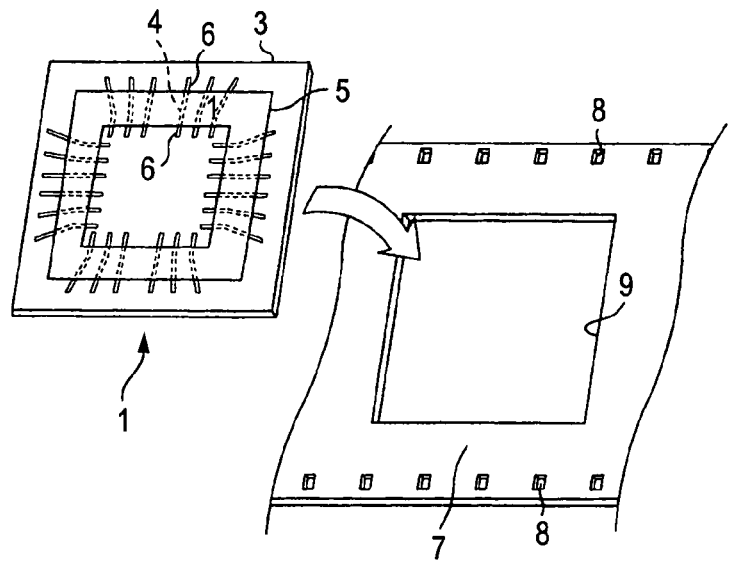
Figure 3C:
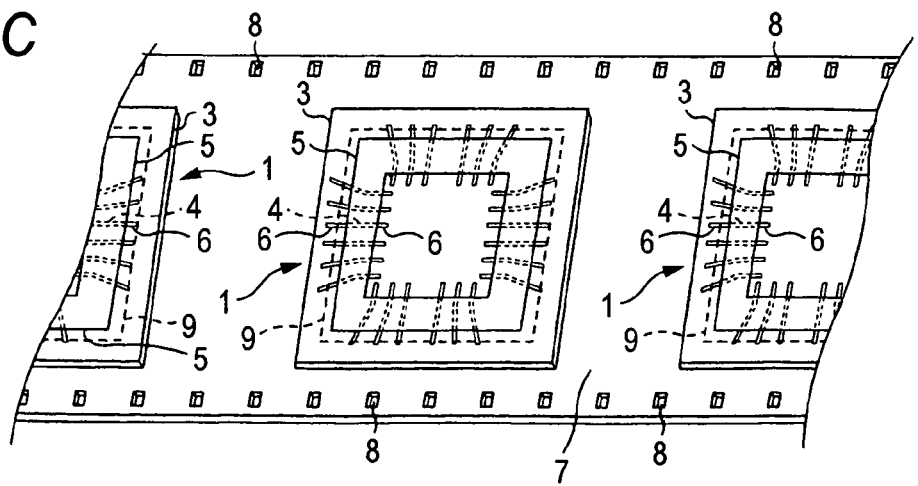

In this method, as shown in FIGS. 3B and 3C, the individual piece-like flexible wiring boards 1 are mounted on the carrying support film 7 formed in the aforementioned manner, so that the opening portions 9 are covered with the individual piece-like flexible wiring boards 1 respectively.

A method for mounting the individual piece-like flexible wiring boards 1 on the carrying support film 7 is not particularly limited. For example, a bonding method using an adhesive agent or a sticking method using a pressure-sensitive adhesive tape may be used as the mounting method. Preferred one of these methods is a method in which each flexible wiring board 1 is bonded to the carrying support film 7 by an adhesive agent. When each flexible wiring board 1 is bonded to the carrying support film 7 by an adhesive agent, the thickness of the TAB tape carrier (i.e., the total thickness of the carrying support film 7, an adhesive layer 10 (see FIG. 4A) and the flexible wiring board 1) can be made uniform more accurately to more surely prevent a difference in level from being formed between the respective flexible wiring boards 1.

Figure 4A:
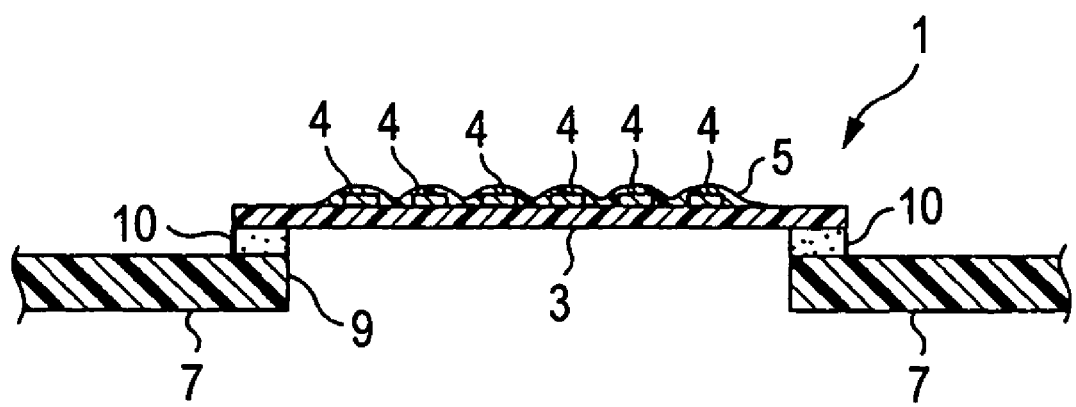
FIGS. 4A and 4B show views in the TAB tape carrier producing method depicted in FIG. 1, FIG. 4A being a sectional view showing a state in which an individual piece-like flexible wiring board is mounted on the carrying support film (in a form in which opening portions are formed) through an adhesive agent, FIG. 4B being a sectional view showing a state in which an individual piece-like flexible wiring board is mounted on the carrying support film (in a form in which no opening portion is formed) through an adhesive agent.

Each flexible wiring board 1 can be bonded to the carrying support film 7 through the adhesive agent as follows. As shown in FIG. 4A, the adhesive agent is applied, for example, on an inner circumferential edge portion in a bonding surface of the flexible wiring board 1 or on the periphery of the opening portion 9 so that the adhesive agent forms a uniform thickness. Then, the flexible wiring board 1 is arranged on the opening portion 9 in the carrying support film 7 so that the opening portion 9 is covered with the flexible wiring board 1. In this condition, the flexible wiring board 1 is bonded to the carrying support film 7 by heating or pressurizing as occasion demands. In this manner, each flexible wiring board 1 is bonded to the carrying support film 7 through the adhesive layer 10.

The adhesive agent is not particularly limited if it can be generally used as an adhesive agent for flexible wiring board. Examples of the adhesive agent allowed to be used include: heat-curable adhesive agents such as a polyimide adhesive agent, an epoxy adhesive agent, an epoxy-nitrile butyl rubber adhesive agent, an epoxy-acrylic rubber adhesive agent, an acrylic adhesive agent, a butyral adhesive agent, an urethane adhesive agent, etc.; thermoplastic adhesive agents such as a synthetic rubber adhesive agent, etc.; and pressure-sensitive adhesive agents such as an acrylic adhesive agent, etc. The thickness of the adhesive layer 10 is selected to be generally in a range of from 1 µm to 20 µm, preferably in a range of from 2 µm to 10 µm.

For mounting each flexible wiring board 1 on the carrying support film 7, positioning marks not shown are formed in advance in portions of the carrying support film 7 on which the flexible wiring boards 1 will be mounted respectively. The flexible wiring boards 1 are positioned on the basis of the positioning marks respectively so as to be arranged on the carrying support film 7 accurately.

In the TAB tape carrier produced in this manner, only individual piece-like flexible wiring boards 1 judged to be non-defective products in the inspection step in advance are mounted on the carrying support film 7. Accordingly, defective flexible wiring boards 1 can be initially prevented from being mounted on the carrying support film 7. For this reason, it is unnecessary to punch out defective flexible wiring boards 1 along with part of the carrying support film 7 and replace the defective flexible wiring boards 1 with non-defective flexible wiring boards 1 in a process after that. Accordingly, a difference in level can be prevented from being formed between the initially mounted flexible wiring boards 1 and the substituted flexible wiring boards 1 because of the replacement. As a result, the yield on continuous production can be improved due to improvement in ratio of non-defective products in spite of simple configuration, so that high connection reliability can be ensured while both improvement in production efficiency and reduction in production cost, especially reduction in cost in a process of assembling electronic parts into an apparatus, can be attained.

According to this method, in the mounting step of mounting the individual piece-like flexible wiring boards 1 on the carrying support film 7, only individual piece-like flexible wiring boards 1 judged to be non-defective products in the inspection step in advance are mounted on the carrying support film 7. Accordingly, the step of replacing defective flexible wiring boards 1 found by inspection with non-defective flexible wiring boards 1 can be omitted compared with the case where flexible wiring boards 1 are inspected after mounted on the carrying support film 7. For this reason, the TAB tape carrier can be produced as a TAB tape carrier on which flexible wiring boards of high connection reliability can be mounted while the yield on continuous production can be prevented from being lowered and while both improvement in production efficiency and reduction in production cost can be attained by simplification of the production process.

Although the above description has been made on the case where each opening portion 9 is formed so as to be similar in shape to but slightly smaller in size than each individual piece-like flexible wiring board 1, the size and shape of the opening portion 9 are not particularly limited if the individual piece-like flexible wiring board 1 can be mounted on the opening portion 9. The opening portions 9 need not be formed in the carrying support film 7 according to the purpose and application.

Figure 4B:
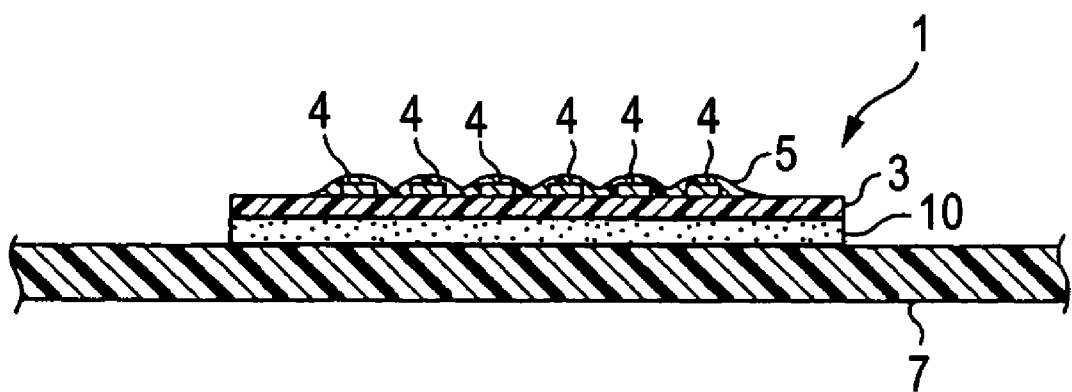

In this case, each flexible wiring board 1 may be mounted on the carrying support film 7 as follows. For example, as shown in FIG. 4B, the adhesive agent is applied on the whole bonding surface of the individual piece-like flexible wiring board 1 or on the whole surface of a mount portion of the carrying support film 7 on which the flexible wiring board 1 will be mounted so that the adhesive agent forms a uniform thickness. Then, the flexible wiring board 1 is bonded to the mount portion. In this manner, each flexible wiring board 1 is bonded to the carrying support film 7 through the adhesive layer 10.

Although the above description has been made on the case where individual piece-like flexible wiring boards 1 are punched out of the circuit sheet 2 and inspected, inspection of the flexible wiring boards 1 may be carried out in any step before the individual piece-like flexible wiring boards 1 are mounted on the carrying support film 7. For example, inspection of the flexible wiring boards 1 may be carried out before the respective flexible wiring boards 1 are punched out of the circuit sheet 2.

Embodiment

A polyimide film 48 mm wide and 75 μm thick was prepared as a carrying support film having two rows of perforations provided in widthwise opposite end portions along the lengthwise direction.

A plurality of rectangular opening portions each having an outer periphery smaller by 2 mm than each individual piece-like flexible wiring board to be mounted later were formed in the carrying support film at regular intervals along the lengthwise direction of the carrying support film by punching.

Then, an epoxy adhesive agent was applied on the periphery of each opening portion so that the adhesive agent is formed with a uniform thickness of 5 μm. Individual piece-like flexible wiring boards (each shaped like a rectangle having a longitudinal width of 25 mm, a lateral with of 35 mm and a thickness of 45 μm) produced separately and judged to be non-defective products in an inspection step were positioned on the adhesive layer on the basis of positioning marks provided in the carrying support film in advance, so that the individual piece-like flexible wiring boards were arranged on the opening portions through the adhesive layer with the result that the opening portions were covered with the individual piece-like flexible wiring boards respectively. In the condition, the individual piece-like flexible wiring boards were thermo-compression-bonded to the carrying support film to thereby obtain a TAB tape carrier.

As described above, in the TAB tape carrier according to the invention, high connection reliability can be ensured while both improvement in production efficiency and reduction in production cost can be attained in spite of simple configuration.

In the TAB tape carrier producing method according to the invention, it is possible to produce a TAB tape carrier on which flexible wiring boards of high connection reliability can be mounted while the yield on continuous production can be prevented from being lowered and while both improvement in production efficiency and reduction in production cost can be attained by simplification of the production process.

The present application is based on Japanese Patent Application 2002-356847, the entire contents of which are incorporated herein by reference.

What is claimed is:

1. A tape carrier for TAB, comprising:
   a carrying support film; and
   individual pieces of flexible wiring boards, each of which includes an electrically insulating base layer made of a resin film and an electric conductor layer made of a metal foil having a predetermined wiring circuit pattern,
   wherein said flexible wiring boards are mounted at regular intervals on mounting portions of said carrying support film, respectively, wherein an interior area defined by an outer perimeter of each of the mounting portions, respectively, has no holes formed therein, and
   wherein an entire surface of each of the flexible wiring boards and an entire surface of each of the mounting portions of the carrying support film are bonded to each other through an adhesive agent, wherein the carrying support film is formed as a flat planar surface, including the mounting portion thereof.

2. The tape carrier for TAB according to claim 1, wherein said carrying support film is a polyimide film.

3. The tape carrier for TAB according to claim 1, wherein a thickness of said electrically insulating base layer is in a range from 3 μm to 100 μm and a thickness of said conductor layer is in a range from 3 μm to 50 μm.

4. The tape carrier for TAB according to claim 3, wherein the thickness of said electrically insulating base layer is in a range from 5 μm to 50 μm and a thickness of said electric conductor layer is in a range from 5 μm to 20 μm.

5. The tape carrier for TAB according to claim 1, wherein said electrically insulating base layer includes polyimide film and said electric conductor layer includes a copper foil.

6. The tape carrier for TAB according to claim 1, wherein the adhesive agent is provided on the entire surface of at least one of the flexible wiring boards and the mounting portions of the carrying support film.

7. The tape carrier for TAB according to claim 1, wherein a thickness of said electrically insulating base layer is in a range from 3 μm to 100 μm.

* * * * *